US012412833B2

United States Patent
Clevenger et al.

(10) Patent No.: US 12,412,833 B2
(45) Date of Patent: Sep. 9, 2025

(54) TOPVIA INTERCONNECT WITH ENLARGED VIA TOP

(71) Applicant: INTERNATIONAL BUSINESS MACHINES CORPORATION, Armonk, NY (US)

(72) Inventors: Lawrence A. Clevenger, Saratoga Springs, NY (US); Chen Zhang, Guilderland, NY (US); Brent Anderson, Jericho, VT (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 939 days.

(21) Appl. No.: 17/304,674

(22) Filed: Jun. 24, 2021

(65) Prior Publication Data
US 2022/0415790 A1    Dec. 29, 2022

(51) Int. Cl.
*H01L 23/528* (2006.01)
*H01L 21/311* (2006.01)
*H01L 21/768* (2006.01)
*H01L 23/522* (2006.01)

(52) U.S. Cl.
CPC .... *H01L 23/5283* (2013.01); *H01L 21/31111* (2013.01); *H01L 21/76802* (2013.01); *H01L 21/76877* (2013.01); *H01L 23/5226* (2013.01)

(58) Field of Classification Search
CPC .................................................. H01L 23/5283
See application file for complete search history.

(56) References Cited

U.S. PATENT DOCUMENTS

| | | | |
|---|---|---|---|
| 6,900,539 B2 | 5/2005 | Motoyama |
| 7,187,085 B2 | 3/2007 | Clevenger |
| 7,470,613 B2 | 12/2008 | Agarwala |
| 8,664,766 B2 | 3/2014 | Yang |
| 8,927,378 B2 | 1/2015 | Pei |
| 9,087,844 B2 | 7/2015 | Kim |
| 9,536,830 B2 | 1/2017 | Bao |
| 9,859,191 B2 | 1/2018 | Lee |
| 9,953,915 B2 | 4/2018 | Chen |

(Continued)

FOREIGN PATENT DOCUMENTS

KR    100827498 B1    5/2008

OTHER PUBLICATIONS

Muhammad Khan and Min Sung Kim, Damascene Process and Chemical Mechanical Planarization, http://classweb.ece.umd.edu/enee416/GroupActivities/Damascene%20Presentation.pdf.

*Primary Examiner* — Yu-Hsi D Sun
(74) *Attorney, Agent, or Firm* — Matthew Zehrer

(57) ABSTRACT

A top via interconnect with enlarged via top and a fabrication method therefor. One embodiment may comprise a semiconductor interconnect structure, comprising a first dielectric layer having a top surface, a bottom metal line formed in the dielectric layer, a second dielectric layer deposited above the top surface of the first dielectric layer, a via etched through the second dielectric layer above the bottom metal line, wherein the via exposes at least a portion of the top surface of the first dielectric layer, and a metal stud in the via that extends over the exposed at least a portion of the first dielectric layer. The metal stud in the via may further comprise a shoulder surface and a convex top surface.

18 Claims, 13 Drawing Sheets

(56) References Cited

U.S. PATENT DOCUMENTS

| | | |
|---|---|---|
| 10,460,990 B2 | 10/2019 | Clevenger |
| 2005/0112957 A1 | 5/2005 | Yang |
| 2007/0202689 A1 | 8/2007 | Choi |
| 2014/0332963 A1 | 11/2014 | Filippi |
| 2016/0005691 A1 | 1/2016 | Liu |
| 2017/0263557 A1* | 9/2017 | Clevenger ......... H01L 21/76885 |

* cited by examiner

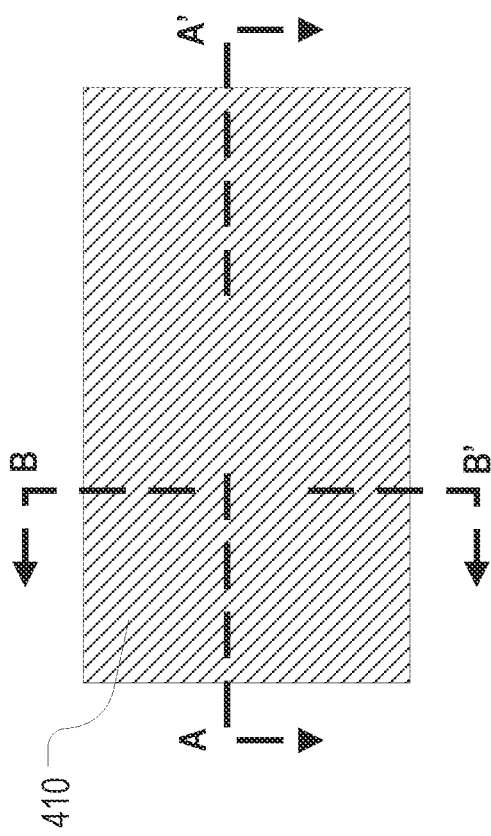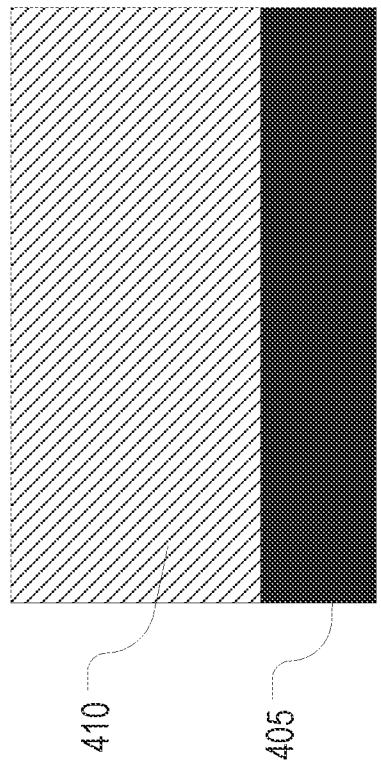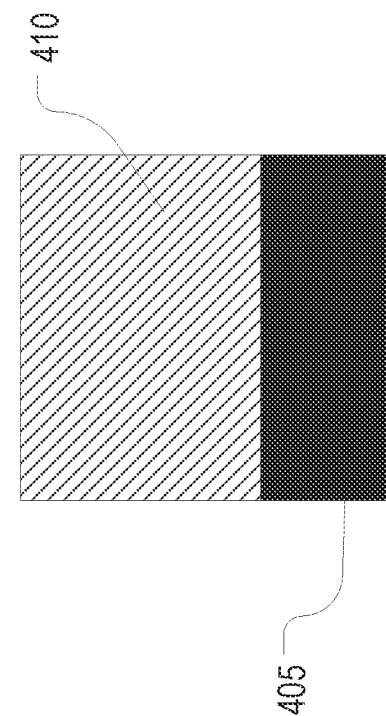

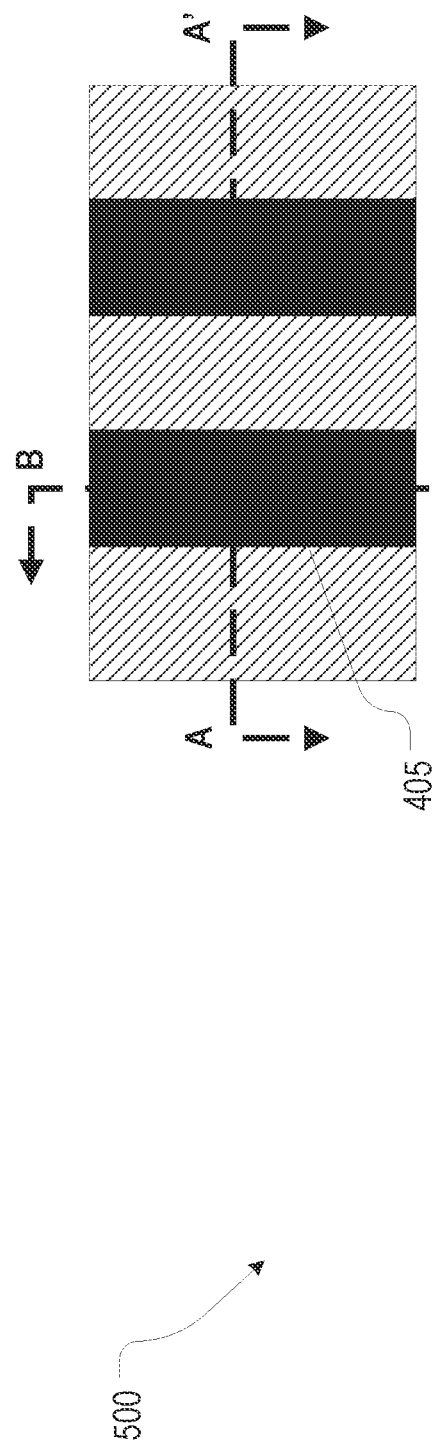
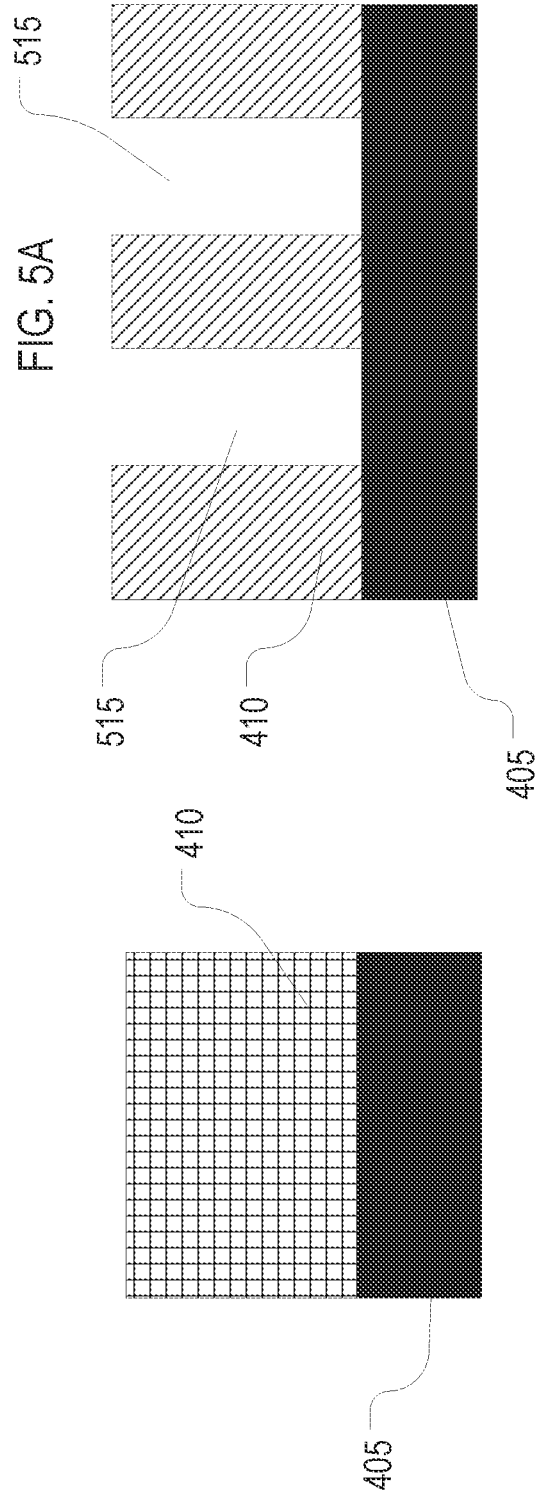
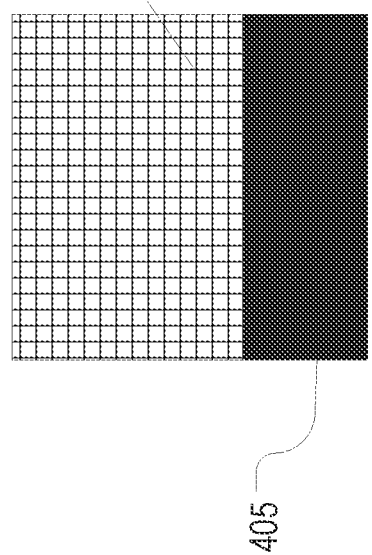

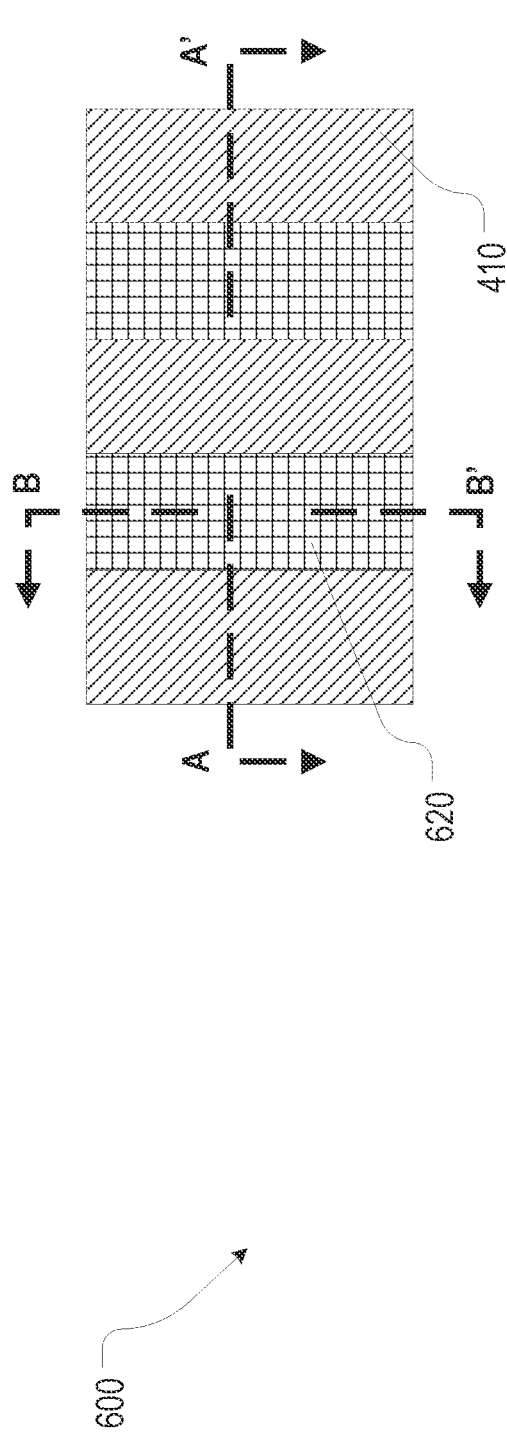
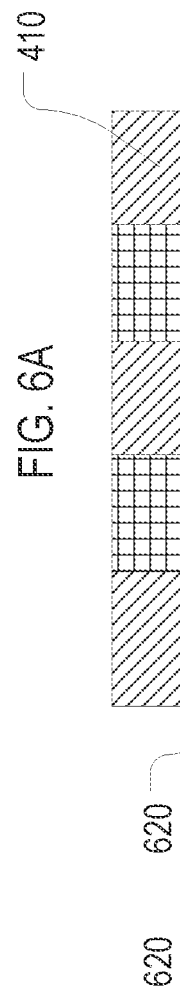
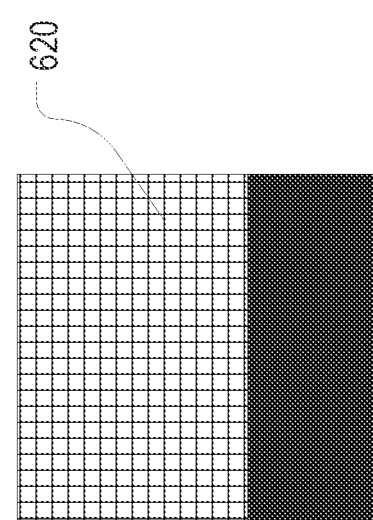

AA' X-SECTION

BB' X-SECTION

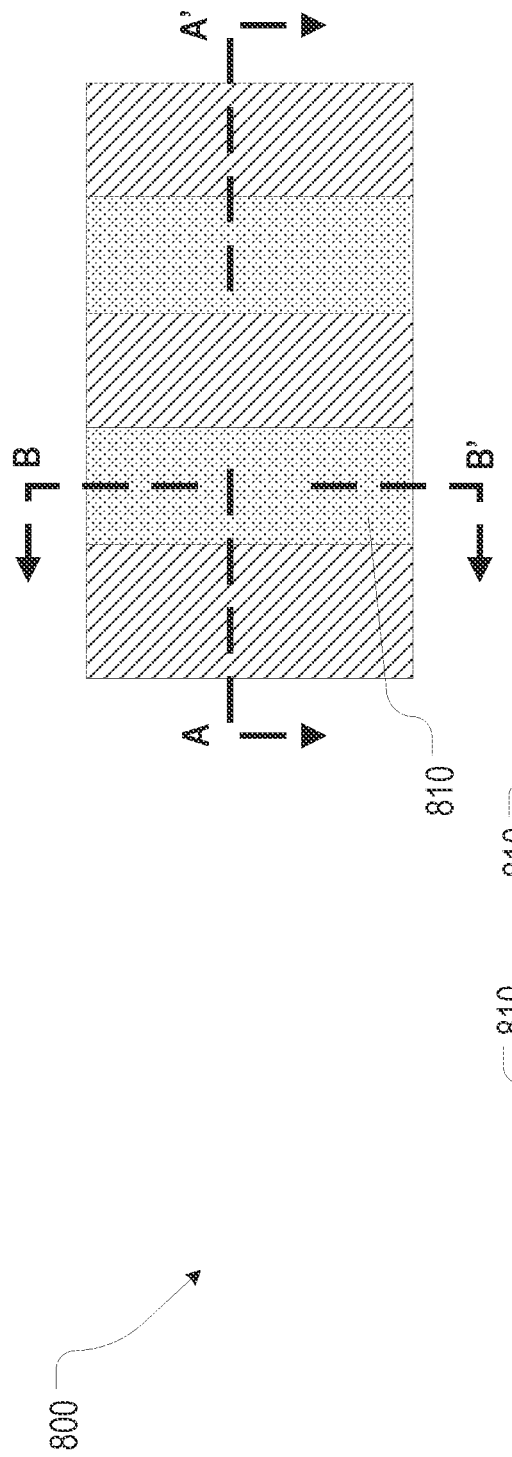
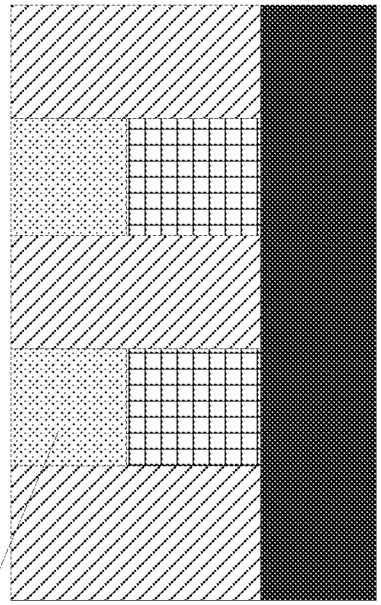
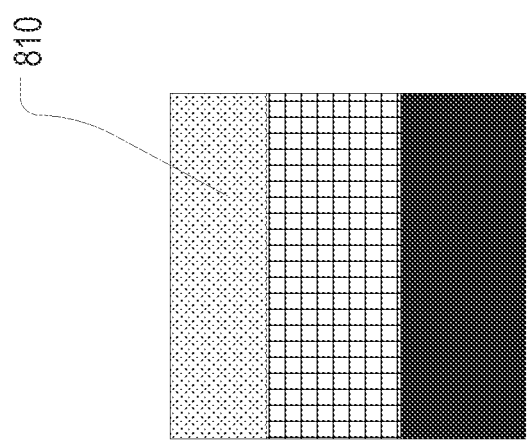
FIG. 8A
FIG. 8B
AA' X-SECTION
FIG. 8C
BB' X-SECTION

AA' X-SECTION

BB' X-SECTION

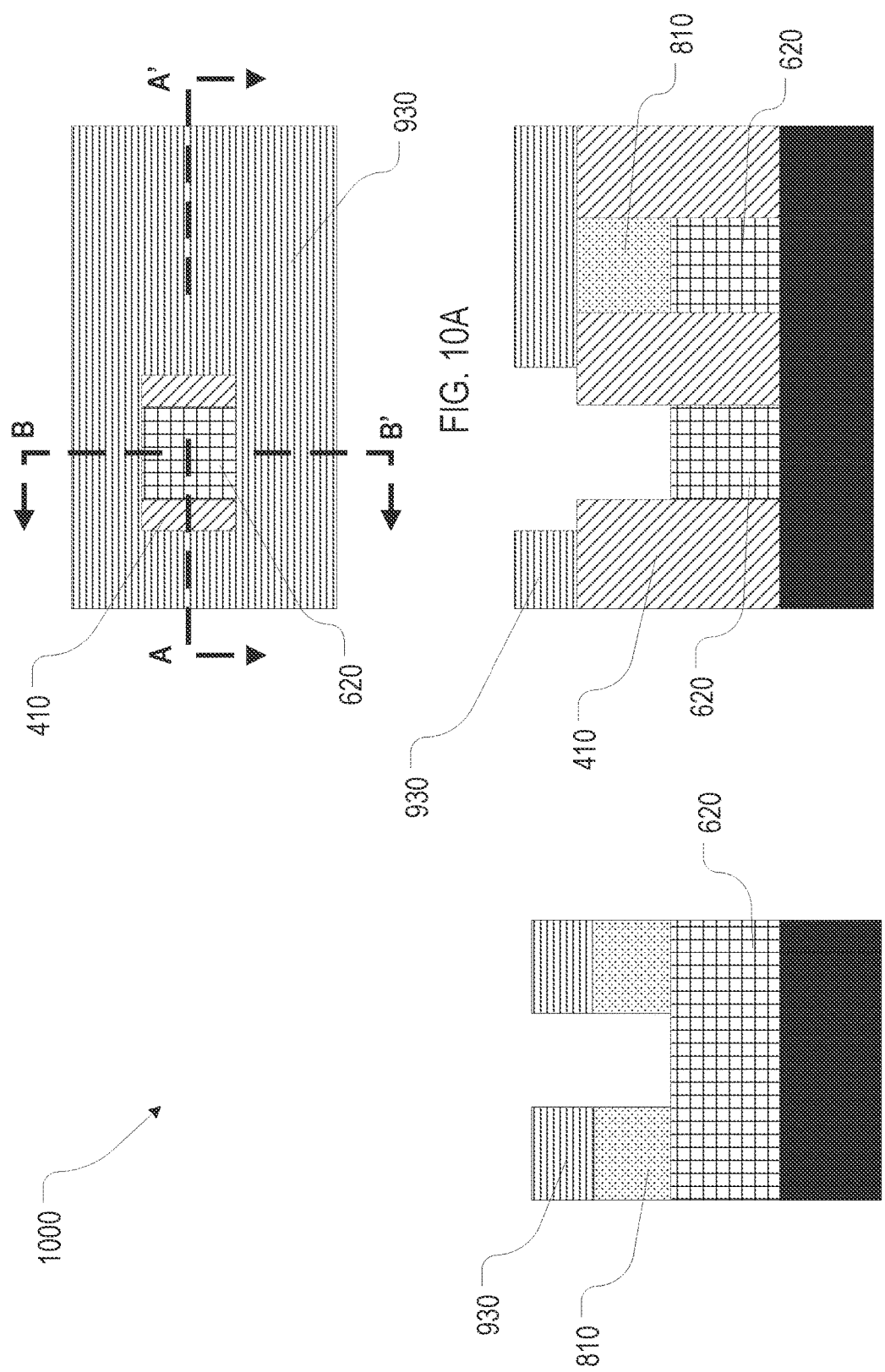

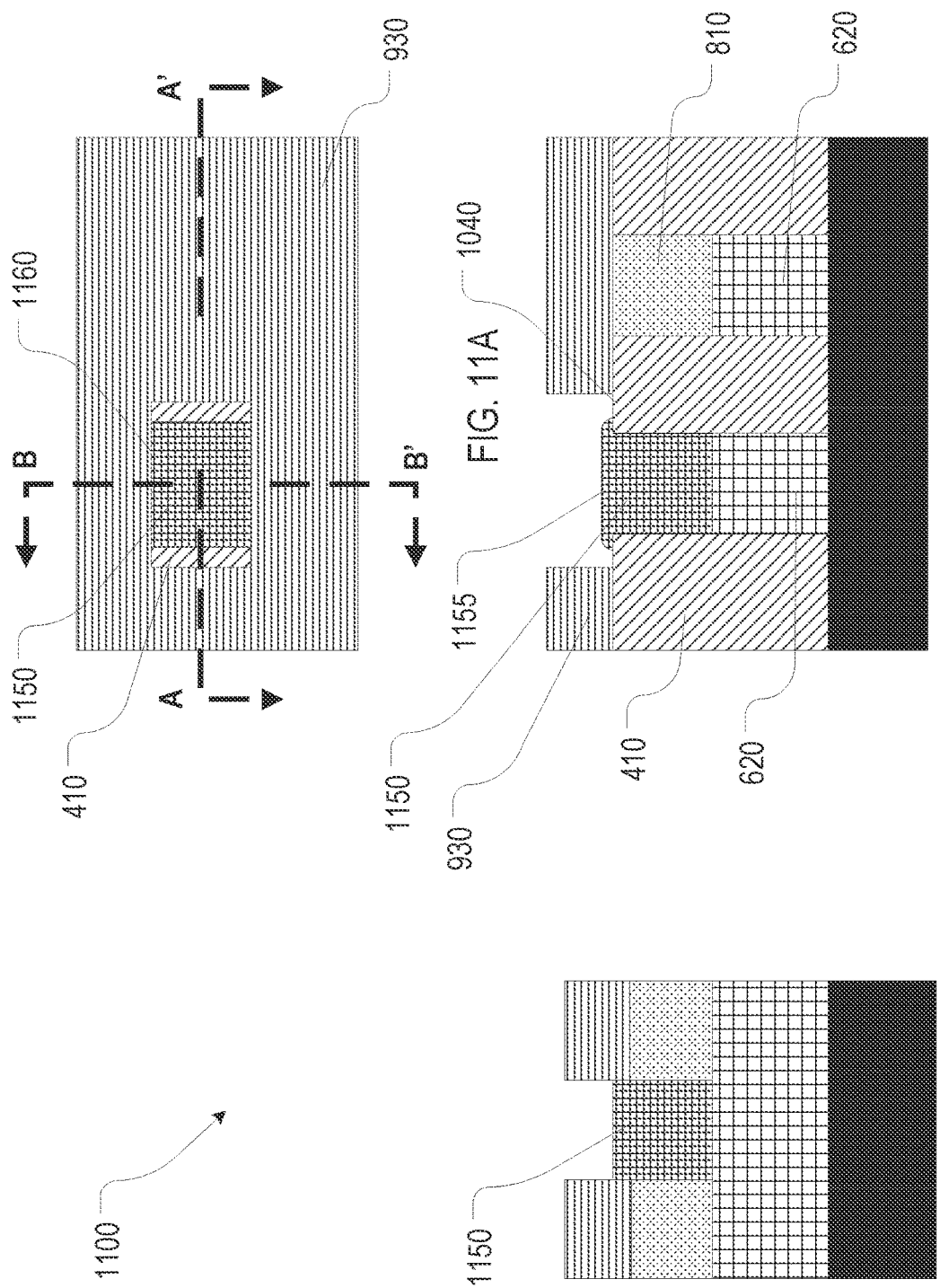

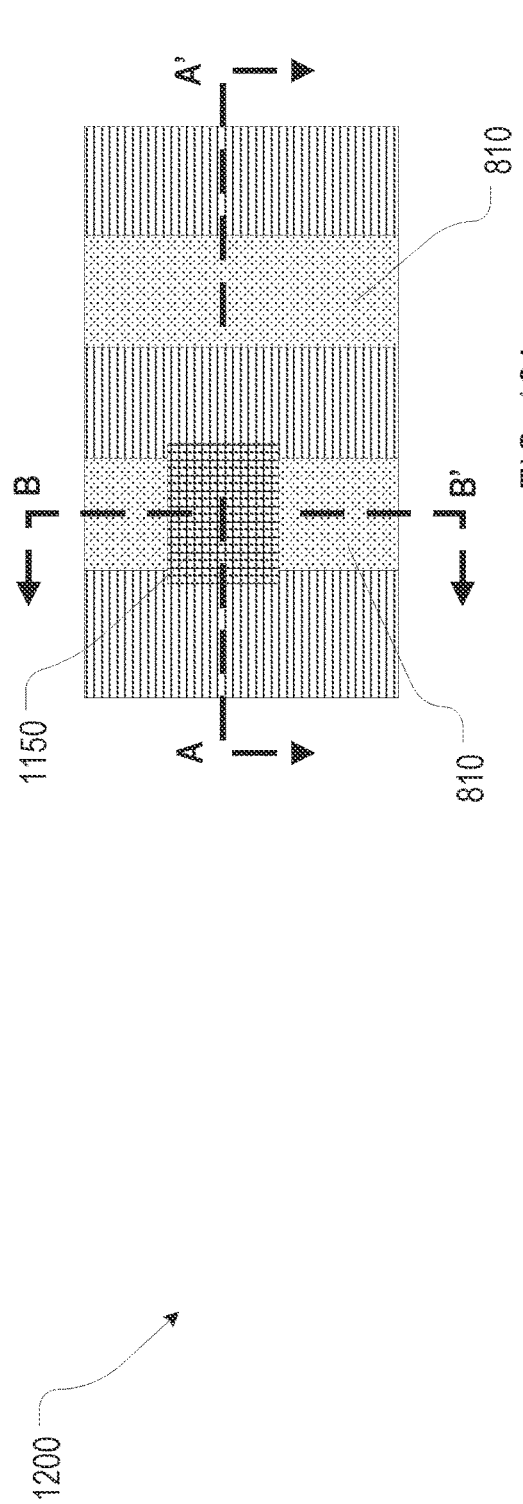
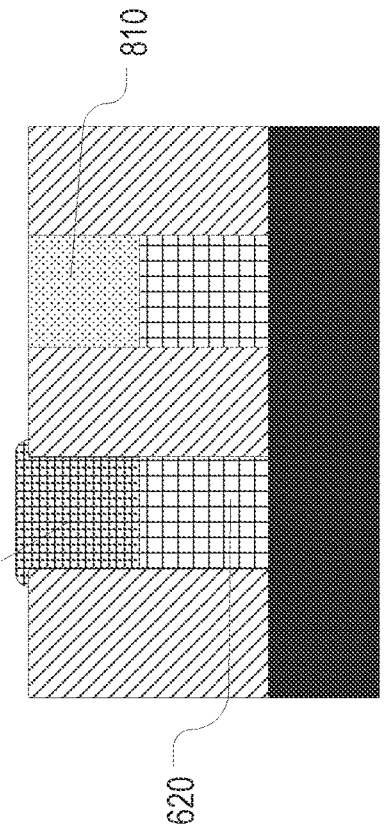
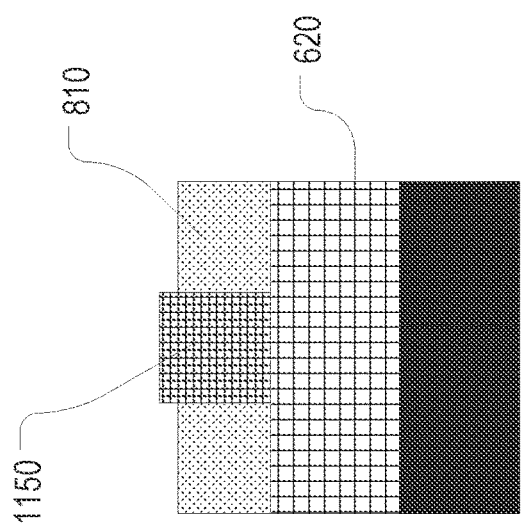
FIG. 12A
FIG. 12B
AA' X-SECTION
FIG. 12C
BB' X-SECTION

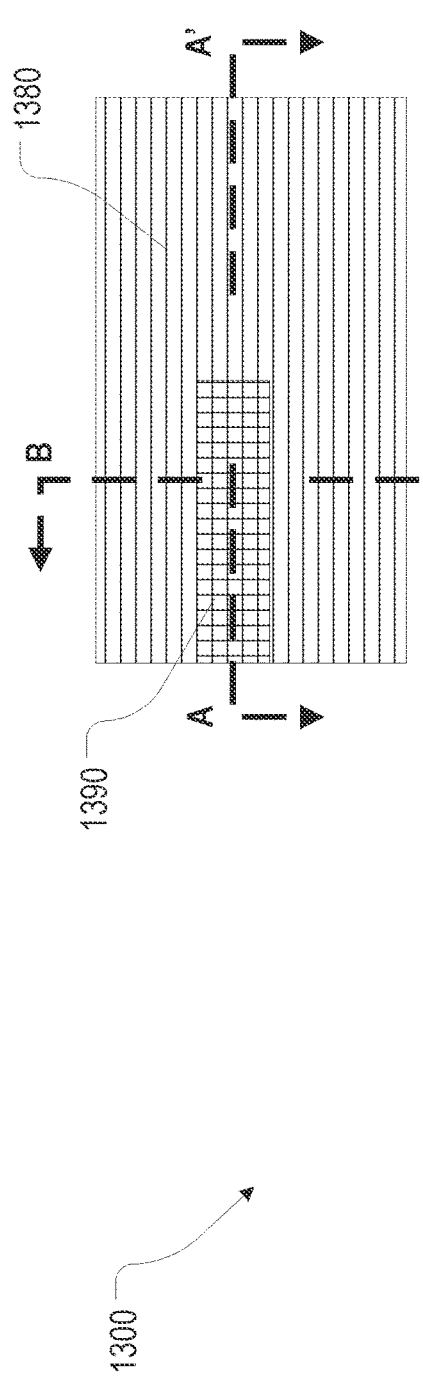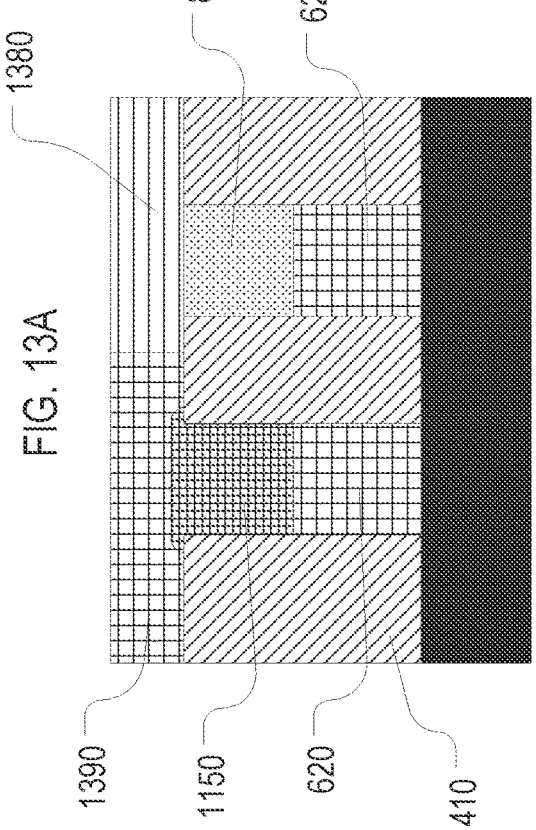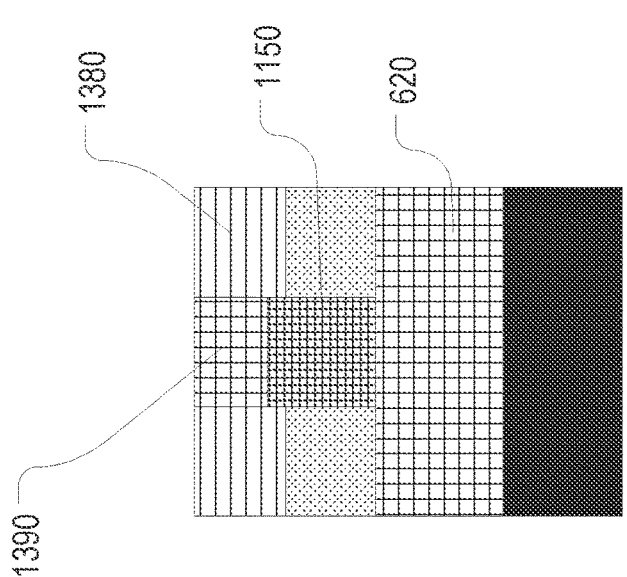

TOPVIA INTERCONNECT WITH ENLARGED VIA TOP

TECHNICAL FIELD

The present disclosure generally relates to a method of forming a semiconductor structure, and the resultant structures. More particularly, the present disclosure relates to a method of forming a TopVia interconnect structure with enlarged via top, and a TopVia interconnect structure with enlarged via top.

BACKGROUND

A semiconductor structure typically contains an array of semiconductor devices interconnected by patterns of conductive wires (lines). Due to the level of integration of semiconductor devices in many modern semiconductor structure, such as processing cores, the necessary interconnections often cannot be made by a single level network of conductive lines. Instead, the necessary interconnections are often formed by two or more levels of conductive lines, which are vertically spaced and separated by an intermediate insulating layer (dielectric layer). In this way, multiple levels of conductor lines may operate to distribute signals among the many semiconductor devices that make up the semiconductor structure.

Interconnections between the different levels of conductive lines can be made using "vertical" through-holes in the insulator layers separating the levels of "horizontal" conductive lines. The through-holes, in turn, are filled with metal to form via studs. The metal stud and through-hole are generally referred to collectively as a via. A "TopVia" generally refers to a via that couples an uppermost level of conductive lines to some other level of the semiconductor structure and/or to another semiconductor structure.

Vias may be described in terms of their physical width, thickness, spacing (i.e., the distance between an interconnect and another on the same level), pitch (i.e., the sum of the width and spacing), and aspect ratio (i.e., the thickness divided by width). The electrical resistance of a via helps determine how far a signal carried by the network of conductive lines may propagate. The width and thickness of the via, as well as the material(s) from which it is made, are some of the factors that determine its electrical resistance.

SUMMARY

According to one or more embodiments, a semiconductor interconnect structure, comprising a first dielectric layer having a top surface, a bottom metal line formed in the dielectric layer, a second dielectric layer deposited above the top surface of the first dielectric layer, a via etched through the second dielectric layer above the bottom metal line, wherein the via exposes at least a portion of the top surface of the first dielectric layer, and a metal stud in the via that extends over the exposed at least a portion of the first dielectric layer. The metal stud in the via may further comprise a shoulder surface and a convex top surface.

According to one or more embodiments, a method of forming a semiconductor interconnect, comprising depositing a first dielectric layer, forming a bottom metal line in the first dielectric layer, and reducing the first metal line in height. The method may further comprise depositing a second dielectric layer, etching a via in the second dielectric layer above the bottom metal line, and filling the via with a first metal such that the first metal extends onto the first dielectric layer. Filling the via with the first metal may comprise using selective deposition in a damascene approach to overgrow a via top over the first dielectric layer to form a mushroom shaped via. Filling the via with a metal may further comprise removing the second dielectric layer; back filling with a third dielectric layer; and forming a top metal line in the third dielectric layer. The mushroom via shape may comprises a convex top surface, wherein the convex top surface extends into the top metal line.

According to one or more embodiments, a semiconductor interconnect formed by the above method.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

(RELATED ART)

FIGS. 4A, 5A, 6A, 7A, 8A, 9A, 10A, 11A, 12A, and 13A are top views that depict devices consistent with some embodiments of the disclosure at various stages of an example process for fabricating those devices.

FIGS. 4B, 5B, 6B, 7B, 8B, 9B, 10B, 11B, 12B, and 13B are cross-sectional views of the devices in FIGS. 4A-13A, taken along the A-A' sectional lines.

FIGS. 4C, 5C, 6C, 7C, 8C, 9C, 10C, 11C, 12C, and 13C are cross-sectional views of the devices in FIGS. 4A-13A, taken along the B-B' sectional lines.

Figure 1:
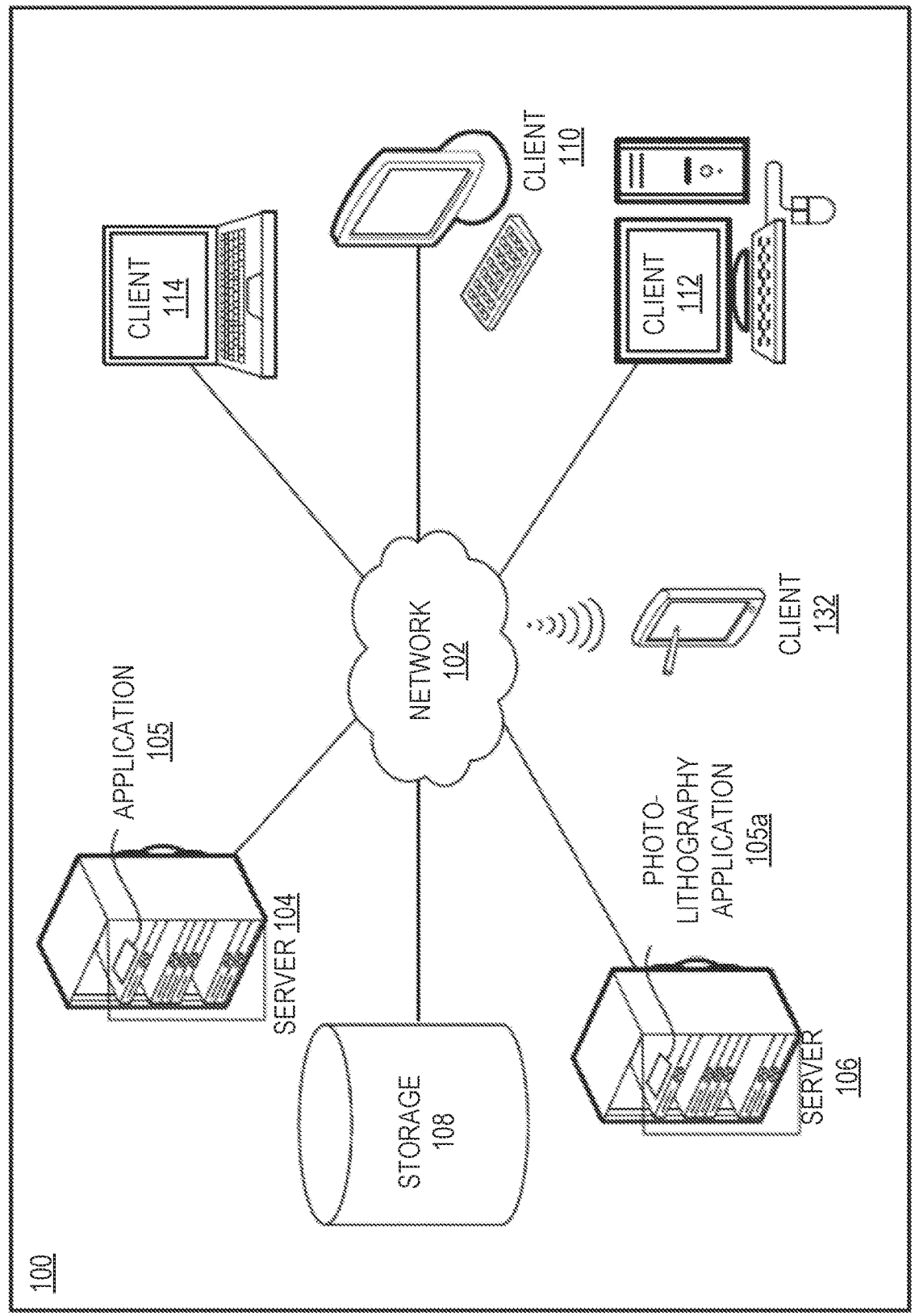
FIG. 1 is a block diagram of a network of data processing environment in which illustrative embodiments may be implemented.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Overview

Aspects of this disclosure relate to a method of forming a semiconductor structure, and the resultant structures. More particularly, this disclosure relates to a method of forming a TopVia interconnect structure with enlarged via top, and a TopVia interconnect structure with enlarged via top. While this disclosure is not necessarily limited to such methods and structures, various aspects of the disclosure may be appreciated through a discussion of various examples using this context.

Some embodiments may include a method and structure in which a top dimension of the via is enlarged so as to maximize electrical contact area and minimize via resistance. This enlarged via may be formed by metallization splits followed by dielectric removal/replacement.

Some embodiments may include a via having top surface (via top) with a mushroom shaped cross section in at least one plane (i.e., perpendicular to at least one axis in three dimensional space). The mushroom shaped via top may extend into a top conductive layer by about 25% of that layer's height (e.g., for a top layer that is 30 nm in height, the mushroom shaped via top may be about 10 nm in height). In other embodiments, the mushroom may extend by between 0% and 50%. The mushroom via top may also overhang a dielectric layer into which it is built in some embodiments.

Some embodiments may include a via top with a mushroom shaped cross section in only one plane. In the later embodiments, the via top may be mushroom shaped in a first plane and substantially planar in a second plane. That is, the mushroom shaped via top may be restricted in one plane parallel to a through-hole of the via. The plane with the mushroom shaped cross section, in turn, may be generally perpendicular to a substrate onto which the via is built. One feature and advantage of these embodiments is they may allow for selective control of the distance to adjacent conductive lines.

Some embodiments may be desirable because the mushroom shaped via top may increase via contact area with the layer of conductor above it, which may decrease electrical resistance of the disclosed via with the line above it, as compared to conventional structures. This lower electrical resistance, in turn, may allow for increased performance of semiconductor structures containing the disclosed via as compared to conventional structures. More specifically, the increased contact area in some embodiments of the disclosed via may have about 20% less electrical resistance, which in turn, may translate into a 1% to 2% performance improvement in the semiconductor structure containing it, as compared to conventional structures.

Some embodiments may use selective deposition to grow the mushroom shaped top surface in a TopVia using a damascene approach to overgrow a via in a through-hole. In the resulting structure, the top width of the via may be larger than the width of the via through-hole itself. Additionally, the via metal may be different than that in the metal line above.

In some embodiments, the metals in the via do not require barrier layers, such as cobalt or ruthenium, at the bottom of the via. Additionally, the entire via metal (not just the barrier layer) may protrude upward into the line above it in some embodiments. Some embodiments may also utilize a "stepped" structure, in which the top width of the via metal may extend into the line above and extends outward beyond the top opening of the etched via feature i.e., the top width of the via may extend beyond the width of the etched via hole.

In addition, some embodiments may include a "TopVia" integration method in which the vias may be formed above, rather than below, the interconnect lines. In this way, some embodiments may allow for electrical contact electrical contact between metallization levels in the back-end-of-line (i.e., not directly connected to transistors).

Data Processing Environment

FIG. 1 is a block diagram of a network of data processing environment in which illustrative embodiments may be implemented. The data processing environment 100 is a network of computers in which the illustrative embodiments may be implemented. The data processing environment 100 includes a network 102. The network 102 is the medium used to provide a communications links between the various devices and computers connected together within the data processing environment 100. The network 102 may include connections, such as wire, wireless communication links, or fiber optic cables.

The data processing environment 100 includes a plurality of clients 110, 112, 114, 132 and a plurality of servers 104, 106 that communicatively couple via the network 102 with a storage unit 108. The clients 110, 112, 114, servers 104, 106, and storage unit 108 depicted in FIG. 1 are devices described with only example roles of certain data processing systems connected to the network 102 and are not intended to exclude other configurations or roles for these data processing systems. Any of the components in the data processing environment 100, such as server 104 or 106, or client 110, 112, 114, or 132 may contain data and may have software applications and/or software tools 105 executing thereon.

Client devices 112, 114, and 132 are examples of client devices. For example, these devices can take the form of a smartphone, a tablet computer, a laptop computer, a wearable computing device, appliance, or as any other suitable device. Software applications and/or tools 105 described as executing in another data processing system in FIG. 1 may, in some embodiments, be configured to execute in the client devices in a similar manner. Data or information stored or produced in another data processing system in FIG. 1 may, in some embodiments, be configured to be stored or produced in the client devices in a similar manner.

Photo-lithography application 105 may be used to implement or partially implement some embodiments described herein. In those embodiments, the photo-lithography application 105 is a software component of a system for fabricating a TopVia interconnect structure with enlarged via top, and a TopVia interconnect structure with enlarged via top. Photolithography application 105 provides instructions to such a fabrication system for causing the assembly of some methods and systems contemplated in some embodiments described herein.

Via Structures

Figure 2:
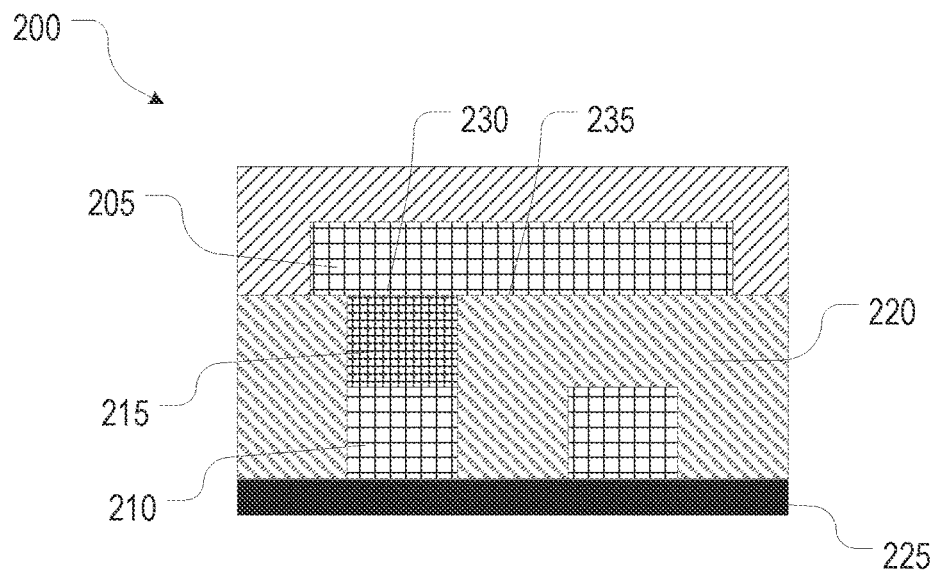
FIG. 2 is a cross sectional view of a related art structure.

FIG. 2 is a cross sectional view of a related art structure 200. As illustrated in FIG. 2, the related art structure 200 includes a top metal line 205 connected to a bottom metal line 210 by a via 215 having a rectangular cross section. The via 215, in turn, is embedded in a dielectric material 220 that was deposited on top of a substrate 225. The via 215 in FIG. 2 has flat top surface 230 that is coplanar with a top surface 235 of the dielectric material 220.

Figure 3:
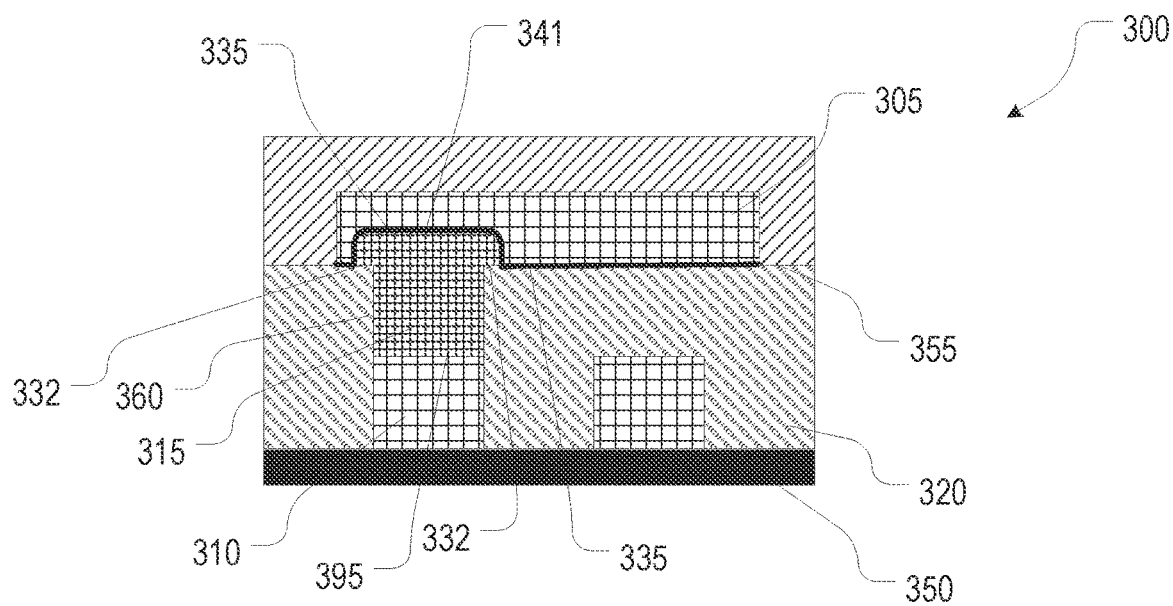
FIG. 3 is cross sectional view of a TopVia semiconductor interconnect structure consistent with some embodiments of this disclosure.

FIG. 3 is cross sectional view of a TopVia semiconductor interconnect structure 300 consistent with some embodiments of this disclosure. The TopVia structure 300 embodiment in FIG. 3 may comprise a top metal line 305 connected to a bottom metal line 310 by a metal stud 315. The metal stud 315, in turn, is deposited or grown in a through-hole 360 formed in a dialectic material 320 that was formed on top of a substrate 350. The TopVia structure 300 in FIG. 3 may also have a barrier and liner material 355 (e.g., transition metal nitride) sandwiched between the top metal layer 305 and both the dielectric layer 320 and the metal stud 315 (i.e., underneath and adjacent to the top metal layer 305, and above and adjacent to the dielectric layer 320 and the metal stud 315).

The metal stud 315 in FIG. 3 may have a generally convexly curved ("convex") top surface 335 in some embodiments. The convex top surface 335 may have a radius of curvature greater than one half of the width of the through-hole 360, such that the metal stud 315 also has two shoulder surfaces 332 that partially extend over and are in contact with a top surface 335 of the dielectric material 320. The amount of overlap may be as large as possible without reducing the distance between an outer edge of the shoulder 332 and the next closest via (not shown) to less than a predetermined minimum distance. This minimum distance, in turn, will depend on the electrical properties of the chosen dielectric material 320. The metal stud 315 may also have at least one generally planar side surface 395 that is substantially perpendicular to the substrate 350.

The convex top surface 335 may have an arc-shaped cross section in some embodiments such that the generally convex top surface 335 forms a partial cylinder in three dimensions. In other embodiments, the generally convex top surface 325 may have a flattened central area surrounded by half-rounded side edges. The top metal lines 305 and the barrier and liner material 355 may both have a generally concave bottom surface 341 that is sized and shaped to precisely receive the generally convex top surface 335. That is, the generally convex top surface 335 will be in complete contact with the barrier and liner material 355, which in turn, may be in complete contact with the generally concave bottom surface 341.

The metal lines 305, 310 may be electrically interconnected via the metal stud 315. In operation, the generally convex top surface 335 of the metal stud 315 may be desirable because it may increase the surface area of contact between the metal stud 315 and the top metal line 305. This increased surface area, in turn, may decrease resistance across the junction between the top metal line 305 and the bottom metal line 310.

In some embodiments, the bottom metal lines 310 may be formed first, on top of (i.e., adjacent to) the substrate 350. The dielectric material 320 may be formed on top of the bottom metal lines 310, and the metal stud 315 may be deposited (and overgrown) in the through-hole 360 formed in the dielectric material 320. The barrier and liner material 355 and the top metal line 305 may formed on top of the metal stud 315 and the dielectric material 320.

Fabrication Method

FIGS. 4A-13A are top views that depict devices consistent with some embodiments of the disclosure at various stages of an example process for fabricating those devices. FIGS. 4B-13B are cross-sectional views of the devices in FIGS. 4A-13A, taken along the A-A' sectional lines. FIGS. 4C-13C are cross-sectional views of the devices in FIGS. 4A-13A, taken along the B-B' sectional lines.

As best shown in FIGS. 4A-4C, a first low K dielectric layer 410 may be first deposited on a substrate 405, followed by a photo-resist layer (not shown). Next, a photo-resist pattern for a first layer (e.g., for the bottom metal lines 310) may be exposed onto the photo-resist layer using a mask and a light source (not shown). After washing away the exposed/developed photo-resist, portions of the low K dielectric layer 410 that were under the exposed/developed photo-resist may be etched away, thereby forming a negative pattern of trenches 515 in the remaining low K dielectric 410. Any remaining unexposed/undeveloped photo-resist layer may then be dissolved by a solvent appropriate for the chosen material and substrate. FIGS. 5A-5C best illustrate the resulting structure 500.

Next, the desired conductive material (e.g., copper, aluminum, etc.) 620 for the bottom metal lines 310 may be deposited into the trenches 515. Suitable methods include, but are not limited to, atomic layer deposition (ALD), chemical vapor deposition (CVD), and physical vapor deposition (PVD). The structure output from this deposition process may then be planarized using, e.g., chemical mechanical planarization (CMP). The resulting structure 600 is best illustrated in FIGS. 6A-6C.

Figure 7A:
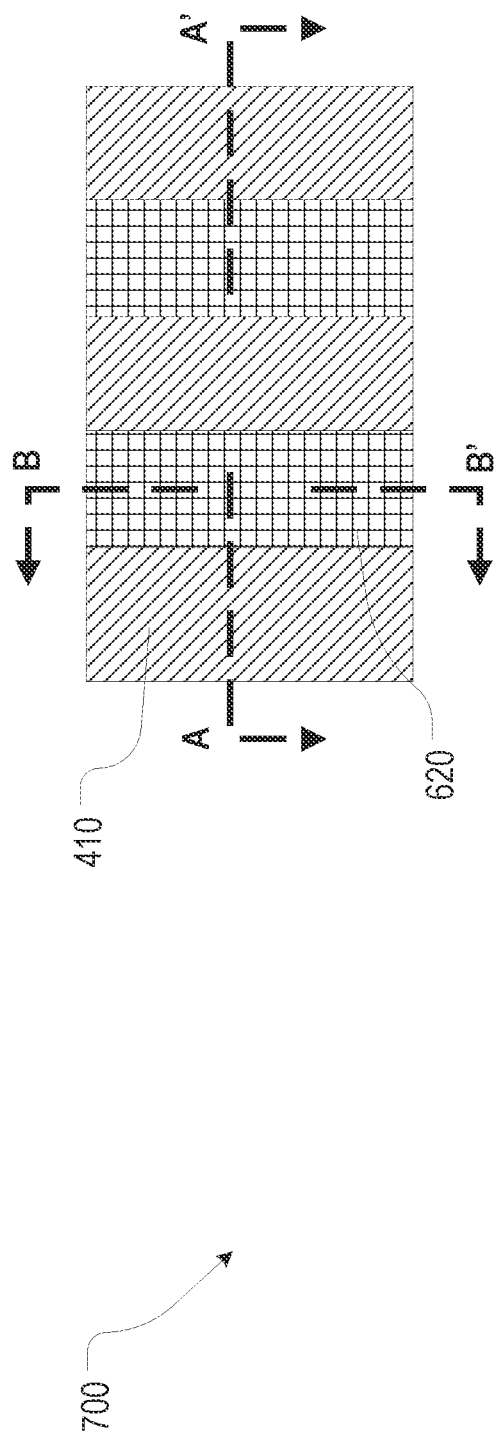
Figure 7B:
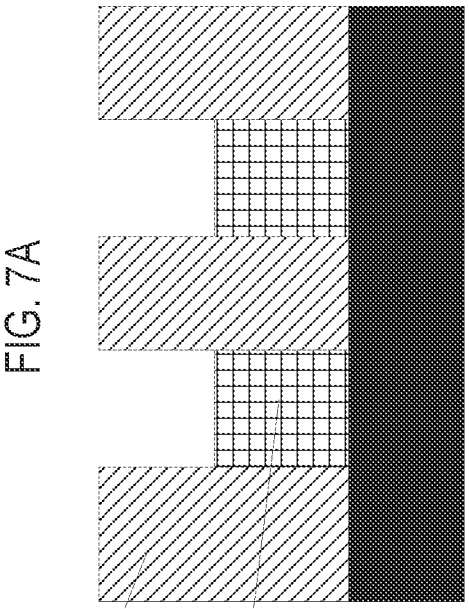
Figure 7C:
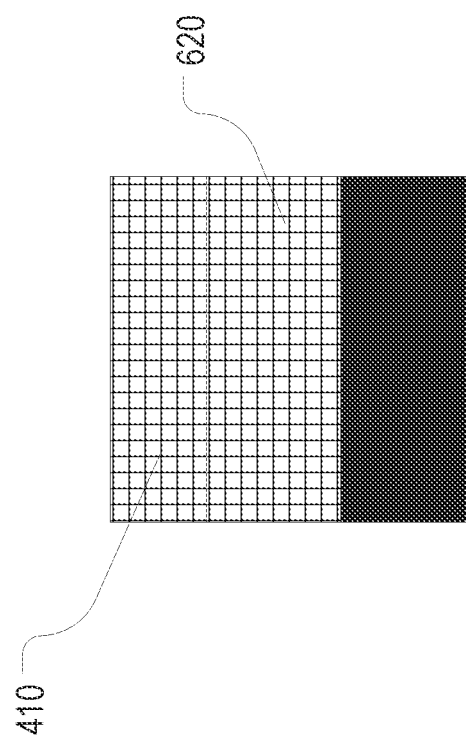

Next, the newly deposited conductive material 620 may be recessed (i.e., reduced in height) using, e.g., wet chemistry, such as a chemical etching process using a solvent appropriate for the selected conductive material. The resulting structure 700 is illustrated in FIGS. 7A-7CC. The resulting recesses may then be filled with a second low K dielectric 810 and planarized using e.g., CMP. The resulting structure 800 is best illustrated in FIGS. 8A-8C.

Figure 9A:
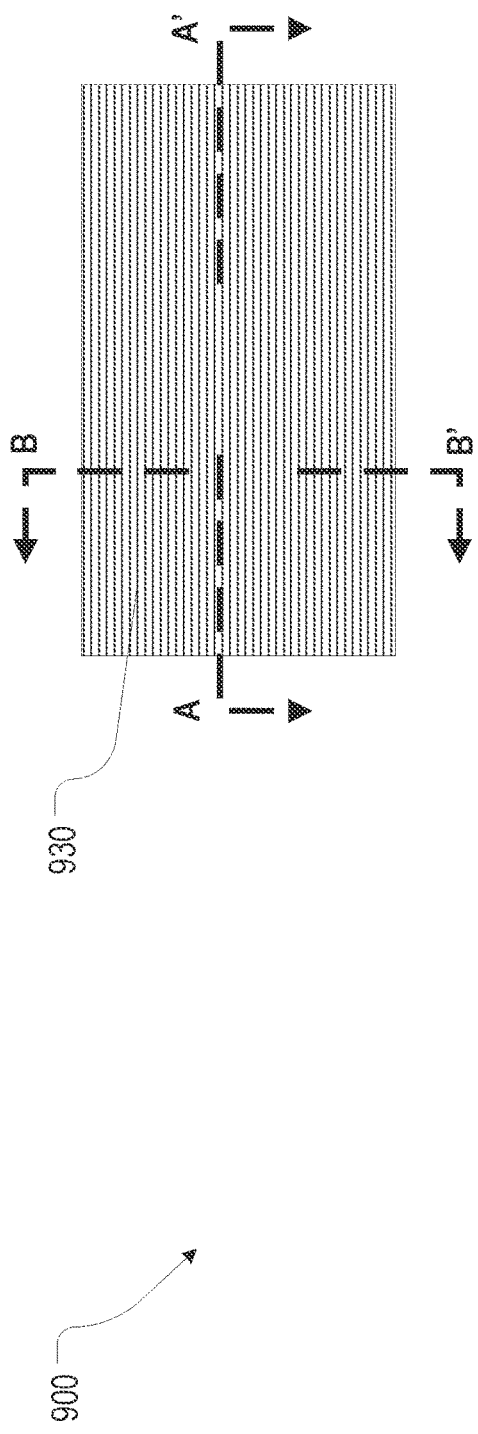
Figure 9B:
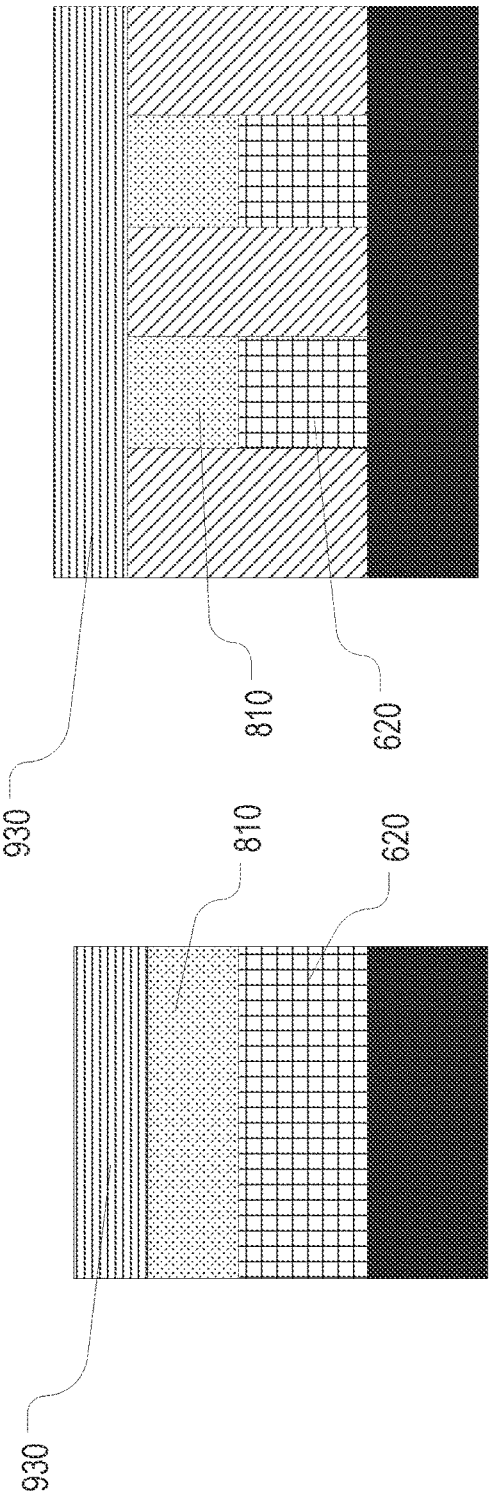
Figure 9C:
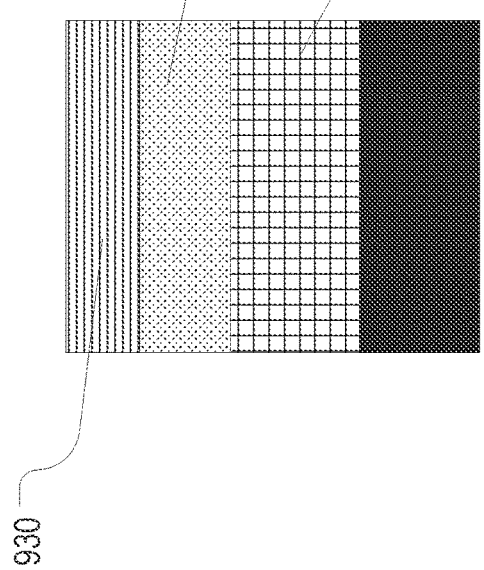

A third low k dielectric layer 930 may be applied over the entire structure and planarized using e.g., CMP. The resulting structure 900 is shown in FIGS. 9A-9C. A pattern lift-off resist layer (not shown) may then be applied for use in forming the next layer of the structure (e.g., the top metal lines 305). A second inverse pattern may then be exposed onto the resist layer using a mask and light source (not shown). After washing away the exposed/developed photo-resist, portions of the second low K dielectric layer 810 and third low k dielectric layer 930 that were under the exposed/developed photo-resist 1025 may be etched away, thereby forming a negative pattern of trenches 1035 in the remaining portions of the second and third low K dielectrics 810, 930. This second inverse pattern may contain patterns of greater size in one direction than did the first inverse pattern, such that an upper surface 1040 of the first low k dielectric 410 is partially exposed, adjacent to the trench 515. The resulting "stepped" structure 1000 is shown in FIGS. 10A-10C.

Metal for a via 1150 may then be deposited on and overgrown to the trench 1035 using e.g., ALD, CVD, or PVD techniques. The chosen metal may be different than that used in one or both of the metal lines 305, 310. The resulting structure 1100 is shown in FIGS. 11A-11C. This process may result in the grown metal material of the via 1150 having a generally convex top surface 1155. As best shown in FIG. 11C, this convex top surface 1155 may laterally expand to cover (i.e., overlap) the upper surface 1040 of the second dielectric layer 810, thereby forming the two shoulder surfaces 332. In some embodiments, the resulting structure of the via 1150 may be confined in one direction by the trench so that lateral expansion in that direction may be limited. This may produce a generally planar surface 1160 in that direction.

The third dielectric layer 930 may then be selectively removed using an isotropic etch process. The resulting structure 1200 is shown in FIGS. 12A-12C. Next, a fourth dielectric layer 1380 may be applied and covered with a photo-resist layer (not shown). A third photo-resist pattern for a top layer (e.g., for the top metal line 305) may be exposed onto the photo-resist layer using a mask and a light source (not shown), washing away the exposed/developed photo-resist, and then etching away the portions of the third dielectric layer 930. Metal 1390 for the top metal layer 305 may then be deposited in the resulting trenches. The resulting structure 1200 is shown in FIGS. 12A-12C. Next, the resulting trenches may be filed with the selected conductive material, and may then be planarized using e.g., CMP. The resulting structure 1300 is best shown in FIGS. 13A-13C.

Figure 14:
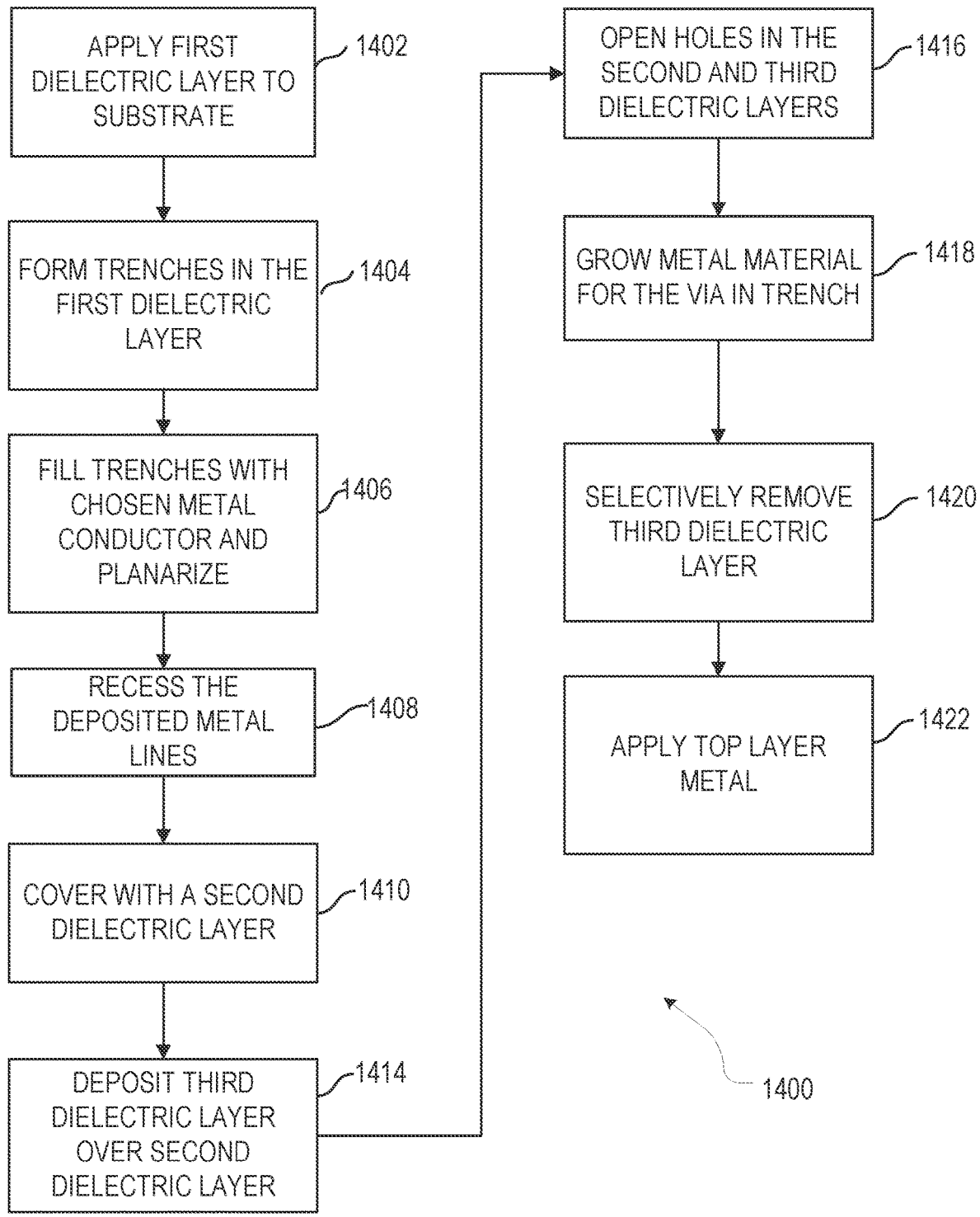
FIG. 14 depict an example computer-implemented process for manufacturing a TopVia interconnect structure with enlarged via top, consistent with some embodiments.

FIG. 14 depict an example computer-assisted process 1400 for manufacturing a TopVia interconnect structure with enlarged via top, consistent with some embodiments. Process 1400 may, in some embodiments, be implemented using the photo-lithography application 105 in FIG. 1. At operation 1402, the photo-lithography application 105 may apply a first dielectric layer 320 to a substrate 350. Next, the photo-lithography application 105 may form trenches in the first dielectric layer 320 for the bottom metal lines 310 at operation 1404. This may include creating a first pattern for the bottom metal lines 310, causing a photo-resist layer to be deposited on the first dielectric layer 320, and exposing that photoresist layer to the first pattern. This may also include washing out the exposed/developed photo-resist and then selectively removing the uncovered dielectric 320. These trenches may be filled with a chosen metal conductor and planarized at operation 1406.

Next, the photo-lithography application 105 may recess the deposited metal lines at operation 1408, and then cover the resulting structure with a second dielectric layer at operation 1410. The second dielectric layer may also be planarized at operation 1410. The photo-lithography application 105 may then deposit a third dielectric layer over the second dielectric layer at operation 1414.

At operation 1416, the photo-lithography application 105 may open holes in the second and third dielectric layers in which the metal stud 315 may be grown. This may include creating a second pattern for the vias of the structure 300, causing a photo-resist layer to be deposited on the third dielectric layer, and exposing that photoresist layer to the second pattern. This may also include washing out the exposed/developed photo-resist and then removing the exposed second and third dielectric to form the through-holes 360.

The metal material for the via may be grown or deposited in the trenches at operation 1418. Next, the third dielectric layer may be selectively removed at operation 1420, and the top layer metal may be applied at operation 1422. This may include creating a third pattern for the top metal line 305 of the semiconductor structure 300, causing a photo-resist layer to be deposited on the third dielectric layer, and exposing that photoresist layer to the third pattern. This may also include washing out the exposed/developed photo-resist and then removing the exposed dielectric to form the trenches, and depositing the chosen conductor into the trenches.

Then, the photo-lithography application 105 and process 1400 may end.

Semiconductor Design

Although this disclosure has been described in detail with reference to certain examples thereof, it may be also embodied in other specific forms without departing from the essential spirit or attributes thereof. For example, some embodiments are capable of being distributed as a set of instructions for a fabrication facility ("fab") encoded onto a computer readable storage media (e.g., a Release Interface Tape or "RIT," a "tape-out," a "GDS2," etc.). The computer readable storage medium, in turn, may be, for example, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

The computer readable instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Embodiments of the present invention may also be delivered as part of a service engagement with a client corporation, nonprofit organization, government entity, internal organizational structure, or the like. Aspects of these embodiments may also include analyzing specifications from the client entity, creating recommendations responsive to the analysis, generating designs for circuitry that implements some or all of recommendations, delivering fabrication instructions for the designs, and testing the resulting circuitry.

GENERAL

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described may include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Therefore, it is desired that the embodiments described herein be considered in all respects as illustrative, not restrictive, and that reference be made to the appended claims for determining the scope of the invention.

What is claimed is:

1. A semiconductor interconnect structure, comprising:
   a first dielectric layer, the first dielectric layer having a top surface;
   a bottom metal line in the first dielectric layer, the bottom metal line having a top surface below the top surface of the first dielectric layer;
   a second dielectric layer above the top surface of the bottom metal line and against respective sidewalls of the first dielectric layer;
   a via etched through the second dielectric layer and resulting in etched surfaces of the second dielectric layer, wherein the via exposes a portion of the top surface of the bottom metal line, respective portions of the sidewalls of the first dielectric layer, and a portion of the top surface of the first dielectric layer; and
   a metal stud in the via that is in contact with the portion of the top surface of the bottom metal line, wherein the metal stud extends over the exposed portion of the top surface of the first dielectric layer, and wherein the metal stud comprises respective surfaces that are coplanar with the etched surfaces of the second dielectric layer.

2. The semiconductor interconnect structure of claim 1, wherein the metal stud in the via further comprises a shoulder surface and a convex top surface.

3. The semiconductor interconnect structure of claim 2, further comprising a top metal line, the top metal line having a concave bottom surface that receives the convex top surface of the metal stud, wherein the convex top surface of the metal stud extends into the top metal line.

4. The semiconductor interconnect structure of claim 3, further comprising an etch stop layer between the convex top surface and the concave bottom surface.

5. The semiconductor interconnect structure of claim 2, wherein the convex top surface has a radius of curvature greater than a width of the via.

6. The semiconductor interconnect structure of claim 5, wherein the via exposes at least a portion of the top surface of the first dielectric layer in only one direction.

7. The semiconductor interconnect structure of claim 6, wherein the convex top surface is a partial cylinder.

8. The semiconductor interconnect structure of claim 2, wherein the shoulder surface is in contact with exposed at least a portion of the first dielectric layer.

9. The semiconductor interconnect structure of claim 1, wherein the bottom metal line comprises a first metal and the metal stud comprises a second metal, wherein the first metal is different than the second metal.

10. A semiconductor interconnect structure, comprising:
    a bottom metal line;
    a top metal line; and
    a mushroom via within at least one dielectric material between the bottom metal line and the top metal line, the mushroom via comprising a through-hole region and a shoulder region above the through-hole region, wherein the through-hole region is in electrical contact with the bottom metal line, wherein a horizontal side-to-side width of the shoulder region is greater than a horizontal side-to-side width of the through-hole region, wherein the shoulder region is above a top surface of the at least one dielectric material and extends into the top metal line, wherein the shoulder region comprises at least one shoulder surface that extends onto and is in contact with the top surface of the at least one dielectric material, and wherein the through-hole region and the shoulder region respectively comprise coplanar front surfaces.

11. The semiconductor interconnect structure of claim 10, wherein the shoulder region further comprises a convex top surface.

12. The semiconductor interconnect structure of claim 11, wherein the top metal line comprises a concave bottom surface that receives the convex top surface of the shoulder region.

13. The semiconductor interconnect structure of claim 12, further comprising an etch stop layer between the convex top surface and the concave bottom surface.

14. The semiconductor interconnect structure of claim 11, wherein the convex top surface has a radius of curvature greater than the horizontal side-to-side width of the through-hole region.

15. The semiconductor interconnect structure of claim 14, wherein the shoulder region contacts the top surface of the at least one dielectric material in only one direction.

16. The semiconductor interconnect structure of claim 10, wherein the through-hole region and the shoulder region respectively comprise coplanar rear surfaces.

17. The semiconductor interconnect structure of claim 10, wherein the shoulder region comprises at least two shoulder surfaces that oppositely extend onto and are in contact with the top surface of the at least one dielectric material.

18. The semiconductor interconnect structure of claim 10, wherein the bottom metal line comprises a first metal and the mushroom via comprises a second metal, wherein the first metal is different than the second metal.

* * * * *